(12) United States Patent
Menuey et al.

(10) Patent No.: US 8,815,342 B2
(45) Date of Patent: Aug. 26, 2014

(54) PROCESS FOR FORMING A PROTECTIVE COATING ON THE SURFACE OF A METAL PART

(75) Inventors: Justine Menuey, Annecy (FR); Andre Hubert Louis Malie, Chatellerault (FR)

(73) Assignee: SNECMA, Paris (FR)

(*) Notice: Subject to any disclaimer, the term of this patent is extended or adjusted under 35 U.S.C. 154(b) by 0 days.

(21) Appl. No.: 13/808,708

(22) PCT Filed: Jul. 8, 2011

(86) PCT No.: PCT/FR2011/051638
§ 371 (c)(1),
(2), (4) Date: Jan. 7, 2013

(87) PCT Pub. No.: WO2012/004548
PCT Pub. Date: Jan. 12, 2012

(65) Prior Publication Data
US 2013/0122198 A1 May 16, 2013

(30) Foreign Application Priority Data
Jul. 9, 2010 (FR) .................................. 10 55633

(51) Int. Cl.
| C23C 16/00 | (2006.01) |
| C23C 16/08 | (2006.01) |
| C23C 10/06 | (2006.01) |
| C23C 10/14 | (2006.01) |
| C23C 10/34 | (2006.01) |
| C23C 10/50 | (2006.01) |
| C23C 10/52 | (2006.01) |

(52) U.S. Cl.
CPC ............... *C23C 16/08* (2013.01); *C23C 10/06* (2013.01); *C23C 10/14* (2013.01); *C23C 10/34* (2013.01); *C23C 10/50* (2013.01); *C23C 10/52* (2013.01); *Y02T 50/67* (2013.01)
USPC ........................................ 427/253; 427/248.1

(58) Field of Classification Search
CPC ................................. C23C 16/08; C23C 16/12
USPC ............................................ 427/248.1, 253
See application file for complete search history.

(56) References Cited

U.S. PATENT DOCUMENTS 8,647,713 B2 * 2/2014 Brossier et al. ............... 427/229
(Continued)

FOREIGN PATENT DOCUMENTS

EP    1 466 996    10/2004
(Continued)

OTHER PUBLICATIONS

Kipkemoi, J. et al., "Rare-earth modified chromium-aluminide coatings applied by pack cementation method on low-alloy steels," Journal of Materials Science, vol. 31, pp. 6247 to 6250, (1996).
(Continued)

*Primary Examiner* — Elizabeth Burkhart
(74) *Attorney, Agent, or Firm* — Oblon, Spivak, McClelland, Maier & Neustadt, L.L.P.

(57) ABSTRACT

The present invention relates to a process for forming on the surface of a metal part a protective coating containing aluminium and zirconium, in which process said part and a cement made of an aluminium alloy are brought into contact with a gas at a treatment temperature in a treatment vessel, the gas comprising a carrier gas and an activator, the activator reacting with the cement to form a gaseous aluminium halide that decomposes on the surface of the part, depositing metallic aluminium thereon, the activator containing a zirconium salt such as ZrO (¾ obtained from granules of a zirconium salt), disassociation reactions of said zirconium salt taking place within a disassociation temperature range with formation of a Zr metal coating on the surface of the part, the assembly comprising the part, the cement and the zirconium salt granules is progressively heated in the chamber from room temperature up to the treatment temperature, the process being characterized in that the treatment chamber is maintained at an overpressure with no carrier gas flow throughout the temperature range corresponding to the disassociation reactions of the zirconium salt.

16 Claims, 1 Drawing Sheet

(56) References Cited

U.S. PATENT DOCUMENTS

2004/0194858 A1* 10/2004 Bacos et al. .................. 148/240
2011/0014370 A1* 1/2011 Brossier et al. ............... 427/229

FOREIGN PATENT DOCUMENTS

EP          1 473 378    * 11/2004
WO          2009 112581    9/2009

OTHER PUBLICATIONS

International Search Report Issued Oct. 19, 2011 in PCT/FR11/51638 Filed Jul. 8, 2011.

* cited by examiner

PROCESS FOR FORMING A PROTECTIVE COATING ON THE SURFACE OF A METAL PART

The present invention relates to the deposition of a protective coating based on aluminum on a metal part. It relates more particularly to the application of such a coating to parts of a turbomachine, notably a gas turbine engine.

A gas turbine engine, such as used for propulsion in the aeronautical field, comprises an atmospheric air intake that communicates with one or more compressors, generally including a fan, which are rotated about one and the same axis. The main stream of this air, after having been compressed, supplies a combustion chamber positioned annularly around this axis and is mixed with a fuel to provide hot gases, downstream, to one or more turbines through which these hot gases are expanded, the turbine rotors driving the compression rotors. The engines operate at a temperature of the engine gases at the turbine inlet which is sought to be as high as possible since performance is linked to it. For this purpose, the materials are selected to withstand these operating conditions and the walls of the parts swept by the hot gases, such as the turbine nozzles or the rotating turbine blades, are provided with cooling means. Furthermore, due to their metallic composition, made of a superalloy based on nickel or on cobalt, it is also necessary to protect them against the erosion and corrosion caused by the constituents of the engine gases at these temperatures.

A known means for ensuring protection of these parts is to deposit an aluminum-based coating on the surfaces liable to be attacked by the gases. Aluminum is attached to the substrate by metal interdiffusion and forms a protective oxide layer on the surface. The additional layer is distinguished from the diffused layer. The thickness of the coating is of the order of a few tens of microns.

The present invention relates to the technique, known per se, of depositing aluminum in the vapor phase, also called aluminization by vapor phase deposition. According to the method, the parts to be treated are placed in a semi-sealed chamber in which the atmosphere consists of a mixture of an inert or reducing gas, for example argon or hydrogen, and an active gas comprising an aluminum halide. At the reaction temperature, between 900° C. and 1150° C., the halide decomposes at the surface of the part into gaseous halogen and into aluminum that diffuses into the metal.

The halide is produced by placing a cement in the chamber with the parts to be treated, which cement is a donor of metallic aluminum or a metal alloy of aluminum with one or more of the metal constituents, notably chromium, of the material forming the parts to be protected, in the presence of granules of a compound of a halogen, chlorine or fluorine, that form the activator. Inert gas is circulated over the activator at a temperature that enables the sublimation of the halogen which is entrained over the donor and with which it reacts to produce the metal halide, which at this temperature is in vapor form.

Since the activator should be gaseous at the temperature of the coating and should not produce contaminants, products such as ammonium chloride, ammonium fluoride or ammonium bifluoride are generally chosen. In the presence of hydrogen or under a neutral gas and at a high temperature, these molecules decompose into ammonia and halogen. The vaporization temperature depends on the nature of the chosen halogenated salt. For example, it is 340° C. for ammonium chloride. The activator is only used for conveying a halogenated acid completely safely into the reactor where deposition is to be carried out, that is to say the semi-sealed container. The cation linked to this halogen (here ammonium) is consequently of no value.

The halide then decomposes in contact with the metal substrate to be coated, enabling aluminum to be deposited. A cyclic process is established during aluminization for the deposition of aluminum that proceeds continuously until the aluminum activity on the surface of the substrate becomes equal to that imposed by the cement. Gaseous halogen is reformed. The coating obtained possibly serves as an intermediate layer between the metal substrate and a protective thermal barrier for this substrate on which it has been applied. The coating makes it possible to improve the holding of the thermal barrier on the substrate and also the capacity of the latter to preserve usage characteristics use in case of degradation of the thermal barrier.

Furthermore, the favorable effect is known of zirconium on the adhesion of an oxide layer on a metal substrate, whether this layer is formed by exposure to air at a high temperature or by deposition of a thermal barrier.

In patent FR 2853329, a vapor phase aluminization method is described that is modified so as to enable aluminum and zirconium to be co-deposited. The ammonium halide of the conventional APVS method is at least partly replaced by a zirconium compound, the presence of which is desired to be seen in trace amounts in the deposit.

Among the zirconium salts capable of performing the role of an activator, mention is made in a non-limiting manner, of zirconium chloride $ZrCl_4$, zirconium oxychloride $ZrOCl_2$ and ammonium fluorozirconate $(NH_4)_2ZrF_6$. All these salts are gaseous above 250° C. Zirconium oxychloride is the preferred activator.

The deposition principle remains identical to that of the APVS method. The cement based on aluminum or an alloy of aluminum and notably chromium is placed, in the form of grains, in a suitable semi-sealed container. The parts to be coated are arranged so as to be brought into contact with the gaseous aluminum halide formed. The ammonium halide activator is entirely or partly replaced by zirconium oxychloride. The chamber in which the container is placed is heated to the APVS treatment temperature. Above a certain temperature, the activator evaporates and forms a vapor rich in zirconium chloride. The latter decomposes at the surface of the substrate made of a nickel superalloy to form zirconium in the metallic state on the one hand, and on the other hand a halogenated acid available to form an aluminum halide in the donor cement. Zirconium deposited at the surface of the substrate then diffuses into the beta-NiAl coating being formed to give an intermetallic compound enriched with between 500 and 1000 ppm (parts per million) of zirconium.

The present applicant has sought to improve the process of aluminization by vapor phase deposition of this type with co-deposition of zirconium, for the purpose of controlling the concentration of Zr in the deposit. A process that uses this technique is described in the patent application published under the number WO 2009/112581 in the name of Snecma.

The process described in this patent application comprises bringing the part and a cement made of aluminum alloy into contact, at a treatment temperature, with an atmosphere containing an activator gas which, on the one hand, reacts with the cement to form a gaseous aluminum halide, which decomposes on contact with the part depositing metallic aluminum thereon and, on the other hand contains $ZrOCl_2$, which decomposes in contact with the part depositing zirconium metal thereon, and is formed by vaporization of solid $ZrOCl_2$. granules at ambient temperature. According to this process, the part, the cement and the $ZrOCl_2$. granules are gradually heated together in a chamber from ambient temperature up to the treatment temperature with a hold at 400° C.±200° C., more particularly at 500° C.±100° C.

For this cycle, the duration of the heating hold is from 5 to 30 minutes, with a temperature rise rate of between 4° C. and 20° C. per minute.

In this way the amount of zirconium deposited is controlled, the hold permitting, on the one hand, good homogenization of the zirconium atmosphere with complete chemical reactions, on the other hand, the rapid temperature rise after decomposition enabling aluminum and zirconium to be deposited simultaneously.

The part contains at least nickel, which combines with aluminum to form, in the coating, an NiAl intermetallic compound in which the aluminum is partially substituted by zirconium. More particularly, the part is made of a superalloy based on nickel.

This process is well suited to the case where an aluminized sublayer of a thermal barrier is formed, such as that formed according to the technique presented in patent EP 1 473 378.

The zirconium in this sublayer makes it possible to stabilize the migration of the aluminum by acting as an aluminum diffusion moderator. Specifically, the aluminum has a tendency to migrate from the sublayer into the substrate, leading to the embrittlement of the sublayer due to the lack of material in the sublayer that results therefrom. Furthermore, the aluminum in the thermal barrier forms alumina which weakens the adhesion of the thermal barrier to the sublayer.

The present invention again aims to improve the above process since in order to have a good service life behavior the zirconium should be located selectively in the aluminide sublayer.

The process described above in the patent application enables the deposition of zirconium throughout the layer with a concentration peak, but this peak remains located in the additional layer. Moreover, the process of patent FR 2 853 329, also cited above, does not provide any teaching that would apply to an industrial facility.

In accordance with the invention, the process for forming a protective coating containing aluminum and zirconium on the surface of a metal part, wherein said part and a cement made of aluminum alloy are brought into contact with a gas at a treatment temperature in a treatment chamber, the gas comprising a carrier gas and an activator, the activator reacting with the cement to form a gaseous aluminum halide, which decomposes at the surface of the part depositing metallic aluminum thereon, the activator containing a zirconium salt, such as $ZrOCl_2$., obtained from zirconium salt granules, the dissociation reactions of said zirconium salt taking place in a dissociation temperature interval with formation of a deposit of Zr metal at the surface of the part, the part, the cement and the zirconium salt granules are gradually heated together in the chamber from ambient temperature up to the treatment temperature, is characterized in that the treatment chamber is maintained at an overpressure without circulation of carrier gas over the temperature interval corresponding to the dissociation reactions of the zirconium salt.

The process of the invention thus makes it possible, by playing with the chemical reactions that take place at the various stages of the heat treatment, to guarantee the deposition of zirconium at the diffused layer—additional layer interface. More specifically, the temperatures and the carrier gases suitable for obtaining the desired result are defined.

The process of the invention optionally comprises the following features, taken alone or in combination:

The temperature rise comprises a hold between 200° C. and 700° C., in particular between 300° C. and 600° C. This interval corresponds to the temperatures of the dissociation reactions of the activator.

The duration of the heating hold is from 5 to 30 minutes.

The treatment container forming the chamber is semi-sealed. The overpressure is slightly above atmospheric pressure and enables the transition gases not to be driven from the reaction zone.

The carrier gas is circulated through the chamber after the temperature of the chamber has exceeded said temperature interval.

The heating is carried out gradually at a temperature rise rate of between 4° C. and 20° C. per minute.

Said activator additionally contains at least one ammonium halide.

The carrier gas is a reducing gas, such as $H_2$, or neutral gas, such as argon.

The part contains at least nickel, which combines with aluminum to form, in the coating, an NiAl intermetallic compound in which the aluminum is partially substituted by zirconium.

The part is made of a superalloy based on nickel.

The zirconium element is at least partly replaced by hafnium or yttrium.

The aluminum alloy comprises chromium.

Said treatment temperature is between 950° C. and 1200° C. and preferably approximately 1100° C.

Other features and advantages will become apparent from the following description with reference to the appended figures.

As was reported above, the process applies advantageously to the treatment of the rotating blades of a turbine, or nozzle vanes.

An aluminum donor cement, consisting of a chromium-aluminum alloy, is placed with the parts to be treated in a semi-sealed container, itself placed in a closed chamber so as to be able to operate in a controlled atmosphere. Use was made of a cement containing 30% aluminum. Other contents of aluminum make it possible to obtain coatings having different structures and different thicknesses.

Also introduced is zirconium oxychloride that forms the activator, which is solid at ambient temperature, in a proportion relative to the cement of a few percent.

The chamber is then purged before introducing the carrier gas that constitutes the initial, argon or hydrogen, atmosphere.

The treatment cycle comprises, as can be seen in the appended graph, a first heating step. The temperature rise is gradual. The temperature rise rate is between 4° C. and 20° C. per minute. When the temperature reaches between 300 and 600° C., this temperature is kept constant for a duration of between 5 and 30 minutes so as to ensure the vaporization of the zirconium oxychloride granules. The temperature rise after the decomposition is determined so as to ensure the deposition of zirconium with that of the aluminum.

During this phase of the cycle, the pressure inside the chamber is maintained at a value slightly above atmospheric pressure. The maintaining of the pressure makes it possible here not to let the transition gases, which are $Zr_2O_3O_2$ and $ZrCl_4$, be driven from the treatment container, since the concentrations are quite low.

These gases originated from the following reactions:

$$2ZrOCl_2 + H_2O \rightarrow Zr_2O_3Cl_2 + 2HCl(g)$$

$$Zr_2O_3Cl_2 \rightarrow \tfrac{1}{2}ZrCl_4(g) + 3/2\, ZrO_2$$

$$ZrCl_4 + 2H_2(g) \rightarrow Zr(s) + 4HCl$$

Once the activator has dissociated and been deposited, the atmosphere is modified and the remainder of the treatment is carried out with a stream of carrier gas that crosses the chamber, the flow rate is advantageously between 5 and 30 l/min; the pressure remaining at atmospheric pressure or slightly above the latter.

When the chamber has reached the aluminization treatment temperature, between 1080° C. and 1180° C., this temperature is maintained for 4 to 16 hours so as to enable the deposition of aluminum and the diffusion thereof into the part.

Figure 1:
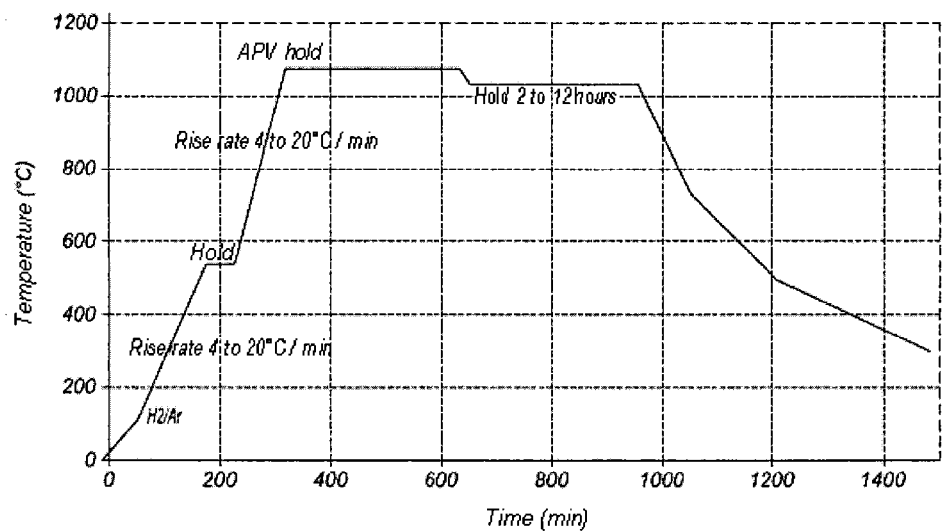
FIG. 1 is a graph representing the change in temperature of a process according to the invention.
Figure 2:
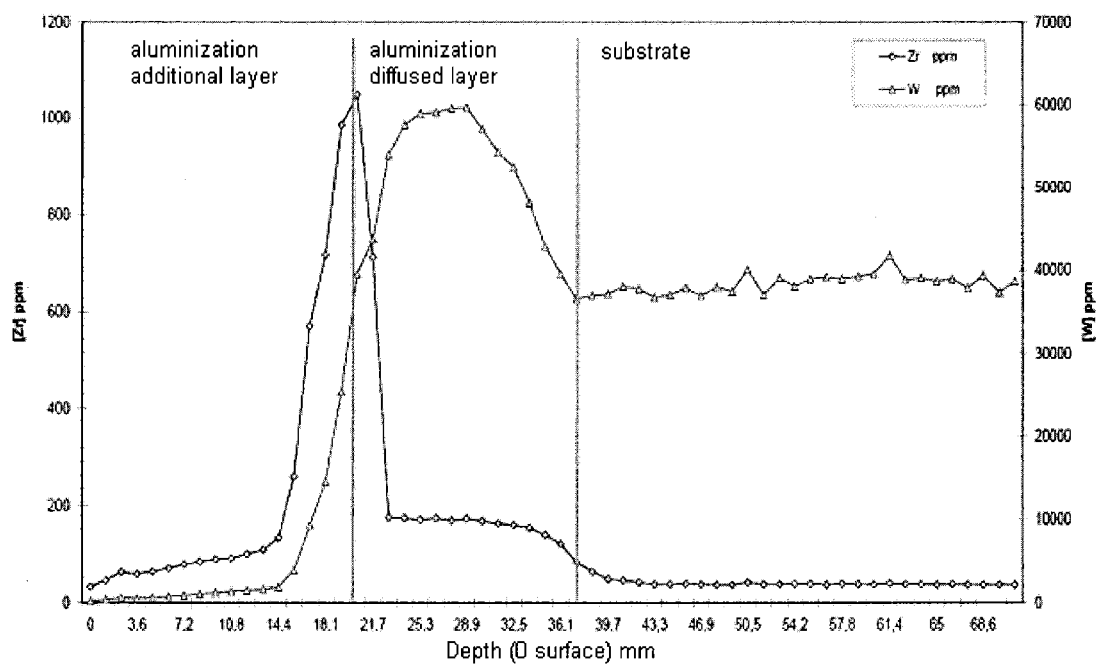
FIG. 2 is a graph representing an example of the change in the amount of zirconium starting from the surface, as a function of the thickness of the aluminized layer.

Represented in FIG. 2 is an example of Zr concentrations, given in ppm, depending on the thickness, given in ppm, from the surface of the part treated in accordance with the invention. The change in the content is a function of parameters such as the atmosphere, the hold temperature and the temperature rise rate. A peak of zirconium concentration is clearly observed in the boundary zone between the additional layer and the diffused layer which, here, is characterized by an increase in tungsten.

The invention claimed is:

1. A process for forming a protective coating comprising aluminum and zirconium on a surface of a metal part, the process comprising:
    gradually heating the metal part, a cement that comprises an aluminum alloy, and zirconium salt granules from an ambient temperature up to a treatment temperature while maintaining at an over-pressure in a treatment chamber, thereby dissociating zirconium salt granules to obtain a zirconium salt as an activator and depositing Zr metal at the surface of the metal part and
    contacting the metal part and the cement with a gas comprising a carrier gas and an activator at a treatment temperature
    thereby reacting the activator with the cement and generating a gaseous aluminum halide, which is capable of decomposing at the surface of the metal part and depositing metallic aluminum thereon,
    wherein the gradually heating does not comprise circulating a carrier gas through the treatment chamber over a temperature interval corresponding to a dissociation reaction of the zirconium salt and wherein the carrier gas is circulated after a temperature of the treatment chamber has exceeded said temperature interval,
    so that a diffused aluminization layer is formed on the surface,
    so that an additional aluminization layer forms on the diffused aluminization layer, and
    so that a majority of the zirconium is deposited at the interface of the diffused aluminization layer and the additional aluminization layer.

2. The process of claim 1, wherein the gradually heating comprises a holding between 200° C. and 700° C.

3. The process of claim 2, wherein a duration of the holding is from 5 to 30 minutes.

4. The process of claim 1, wherein the gradually heating has a temperature rise rate of between 4° C. and 20° C. per minute.

5. The process of claim 1, wherein the activator further comprises an ammonium halide.

6. The process of claim 1, wherein the carrier gas is a reducing gas or a neutral gas.

7. The process of claim 6, wherein the carrier gas is $H_2$.

8. The process of claim 6, wherein the carrier gas is argon.

9. The process of claim 1, wherein the metal part comprises a nickel-based superalloy.

10. The process of claim 1, wherein a zirconium element is partly replaced by hafnium or yttrium.

11. The process of claim 1, wherein the treatment temperature is between 950° C. and 1200° C.

12. The process of claim 1, wherein the gradually heating comprises a holding between 300° C. and 600° C.

13. The process of claim 1, wherein the treatment temperature is approximately 1100° C.

14. The process of claim 1, wherein the zirconium salt is $ZrOCl_2$.

15. The process of claim 1, wherein the treatment chamber is semi-sealed.

16. The process of claim 1, wherein the aluminum alloy comprises chromium.

* * * * *